US008564277B2

(12) United States Patent
Wortham et al.

(10) Patent No.: US 8,564,277 B2
(45) Date of Patent: Oct. 22, 2013

(54) SYSTEM FOR AND METHOD OF VIRTUAL SIMULTANEOUS SAMPLING WITH A SINGLE ADC CORE

(75) Inventors: Jason Wortham, Fremont, CA (US); Urs Mader, Cupertino, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 907 days.

(21) Appl. No.: 12/551,431

(22) Filed: Aug. 31, 2009

(65) Prior Publication Data

US 2011/0050278 A1    Mar. 3, 2011

(51) Int. Cl.
*G01R 17/02* (2006.01)
*G01R 19/10* (2006.01)

(52) U.S. Cl.
USPC .......................................... 324/99 R

(58) Field of Classification Search
None
See application file for complete search history.

(56) References Cited

U.S. PATENT DOCUMENTS

| | | | |
|---|---|---|---|
| 4,500,837 A * | 2/1985 | Shuey et al. ............... 324/103 P |
| 5,914,606 A * | 6/1999 | Becker-Irvin ............... 324/434 |
| 6,324,339 B1 * | 11/2001 | Hudson et al. ............... 320/135 |
| 6,518,725 B2 * | 2/2003 | Marten ............... 320/116 |
| 2002/0180447 A1 * | 12/2002 | Masse et al. ............... 324/433 |
| 2006/0007622 A1 * | 1/2006 | Furukawa et al. ............... 361/115 |
| 2007/0083582 A1 * | 4/2007 | Chambers ............... 708/490 |
| 2008/0185994 A1 * | 8/2008 | Altemose ............... 320/118 |
| 2011/0140662 A1 * | 6/2011 | Li ............... 320/116 |
| 2011/0204855 A1 | 8/2011 | LoCascio | |

OTHER PUBLICATIONS

MAX1785 Advanced Smart Battery-Pack Controller, Maxim Integrated Products, pp. 1-128, Aug. 16, 2007.
MAX1781 Advanced Smart Battery-pack Controller, Maxim Integrated Products, pp. 1-96, Mar. 16, 2004.

* cited by examiner

*Primary Examiner* — Jermele M Hollington
(74) *Attorney, Agent, or Firm* — North Weber & Baugh LLP

(57) ABSTRACT

Voltage balancing in multi-cell battery packs is improved by estimating instantaneous voltages on the cells. In accordance with one embodiment, an apparatus for reading voltages from multiple voltage sources includes a first multiplexer coupled to multiple voltage sources and a controller. The controller is programmed to output from the first multiplexer a sequential pair of voltages read from each of the multiple voltage sources. The multiple sequential pairs of voltages all have a common midpoint in time. The multiple sequential pairs of voltages are all read within a small time window, such as 100 microseconds. In one embodiment, the multiple voltage sources are Li-ion or other high-voltage cells, though other types of cells can also be used.

25 Claims, 9 Drawing Sheets

SYSTEM FOR AND METHOD OF VIRTUAL SIMULTANEOUS SAMPLING WITH A SINGLE ADC CORE

FIELD OF THE INVENTION

This invention relates to batteries. Specifically, this invention relates to sensing voltages on multi-cell battery packs.

BACKGROUND OF THE INVENTION

With increasing energy prices and the environmental impact associated with traditional energy sources, battery-driven cars, generators, and other products are becoming cheaper and more practical alternatives. To power many of these larger products, batteries must be packaged into multiple-cell battery packs, a design that has special requirements. For example, for a battery pack to be both efficient and long-lasting, its individual cells must be balanced. This is especially true for high-voltage battery packs used in electrical vehicles (EVs), hybrid electrical vehicles (HEVs), and industrial applications.

Many EVs and HEVs use lithium-ion (Li-ion) cell battery packs. These cells have high energy densities, high open-circuit voltages, and low self-discharge rates. They are also relatively light. Unfortunately, multi-cell Li-ion batteries are prone to failure when the charges on the individual cells are not balanced. For example, when the cells are not balanced, charging lower-charged cells to their capacity results in over-charging the higher-charged cells. Such overcharging can be dangerous and is particularly damaging for Li-ion cells, which cannot tolerate over charging. When discharging higher-charged cells, a lower-charged cell may be discharged below an acceptable limit, again resulting in cell damage. Both types of damage occur in EVs and HEVs, which have large numbers of recharging and discharging cycles.

Proper balancing requires that each cell be charged or discharged by an amount that brings all the cells to a similar voltage. This in turn requires accurate cell voltage readings, difficult in EV and HEV applications, where motor vibrations, variations in temperatures within the engine compartment that houses the battery-pack, variations in the measurement components themselves, time lags between measuring the individual cells, all can reduce the accuracy of the voltage readings. When differences between cell readings are inaccurate, cell balancing is also inaccurate, reducing the likelihood that the cell balancing will protect the cells as intended.

In previous multi-cell battery systems having n cells, balancing occurred by sensing a voltage on a cell in one polarity and then reversing the polarity and sensing that voltage. This process continued for each cell. Temporal displacement of these measurements introduced errors into the balancing process.

In another prior balancing technique, the voltages on cells 1 though n were sensed in a first polarity. The polarity was reversed and the process repeated with the other polarity. This process also introduced temporal displacement errors into the balancing process.

Temporal displacement errors can be eliminated by adding a voltage sensor for each cell and simultaneously sensing the voltage for all cells. Unfortunately, this technique is expensive.

Many cells are required to power vehicles, such as EV or HEV vehicles, which use relatively expensive battery packs. Because an entire pack must be replaced when any individual cell in the pack fails, such failures are costly in EVs, HEVs, and other applications that use multiple cells.

SUMMARY OF THE INVENTION

In a first aspect of the invention, an apparatus for reading voltages from multiple voltage sources includes a first multiplexer for coupling to multiple voltage sources and a controller. The controller causes the first multiplexer to output a sequential pair of voltages read from each of the multiple voltage sources. The multiple sequential pairs of voltages all have a common midpoint in time.

In one embodiment, the apparatus includes a first-order R-C filter coupling the multiple voltage sources to the first multiplexer. The apparatus also includes multiple voltage sources, such as Lithium-ion cells, coupled to the RC-filter. The first multiplexer is preferably a high-voltage chop multiplexer.

An output of the first multiplexer is coupled to an analog high-voltage level shifter, which is coupled to a single analog-to-digital converter. A low-voltage chop multiplexer couples the analog high-voltage level shifter to the single analog-to-digital converter.

The controller uses the multiple sequential pairs of voltages to estimate simultaneous readings of the multiple voltages. The estimated simultaneous readings are used to determine parameters for substantially balancing the multiple voltages.

In one embodiment, the apparatus also includes a voltage balancer operable with the controller to substantially balance the multiple voltage sources. The multiple sequential pairs of voltages are preferably all read within a pre-determined time window. In a preferred embodiment, the time window is 100 microseconds wide.

In different embodiments, the multiple voltage sources are used to power an automobile engine, an industrial machine, or any other type of high-powered equipment. Alternatively, the multiple voltage sources are used to power a portable computer, a digital camera, or some other low-powered device.

In a second aspect of the invention, a method of estimating virtually simultaneous readings of multiple voltages includes taking a sequential pair of voltage readings from each of multiple voltage sources. The multiple sequential pairs have a common midpoint in time. Each of the multiple sequential pairs is averaged to thereby estimate virtually simultaneous readings of the multiple voltage sources. For each of the multiple voltages sources, the sequential pair of voltage readings are taken at different polarities to thereby reduce measurement errors.

In one embodiment, voltages on each of the multiple voltage sources are filtered using a first-order RC filter.

In another embodiment, the multiple voltage sources are all lithium-ion batteries, and the multiple sequential pairs of voltage readings are all taken within a 100 microsecond window.

In still another embodiment, the method also includes determining simultaneous current readings from each of the multiple voltage sources to a motor. The multiple current readings and the estimated simultaneous readings from the multiple voltage sources are all used in a fuel-gauging algorithm.

In a third aspect of the invention, a method of balancing voltages from multiple voltage sources includes averaging multiple voltages. The multiple voltages include one or more sequential pairs of readings from each of the multiple voltage sources, and the sequential pairs all share a common midpoint in time. The multiple averaged voltages are used to control charging, discharging, or both of the multiple voltage sources to thereby balance the voltages on the multiple voltage sources.

DETAILED DESCRIPTION OF THE EMBODIMENTS

Embodiments of the invention more accurately detect voltage differences between cells in a multi-cell battery pack. It is recognized that time differences between cell readings can introduce measurement errors. As one example, in EVs and HEVs, switched currents generated by pulse-width-modulation (PWM) motor controllers can create voltage ripples on the battery stack, causing an aliasing problem when all the cells are not measured together. Load transients from vehicle starts and stops will cause lower frequency voltage transients on the battery as well. Both of these effects result in inaccurate voltage readings, which reduce the effectiveness of any voltage balancing.

In these and other applications, measuring the voltages on multiple cells at different times can indicate a voltage difference even when none exists or can exaggerate any differences that do exist. One solution is to measure, or to approximate, simultaneous voltage readings. In this way, the voltage differences can be better approximated, resulting in more precise voltage balancing. Specifically, voltage ripples and aliasing are both reduced by virtually simultaneous sampling techniques in accordance with embodiments of the invention.

In accordance with embodiments of the invention, virtually simultaneous readings of multiple cells are approximated by taking pairs of voltage readings (samples) on each cell such that the readings for all the pairs share a common midpoint in time. Preferably, the voltages in a pair are taken at different polarities, thereby reducing errors introduced by some of the measuring components. As one example, the polarities are switched by reversing the two (e.g., positive and negative) input terminals. The voltages in these pairs are referred to as "chopped" samples.

Figure 1:
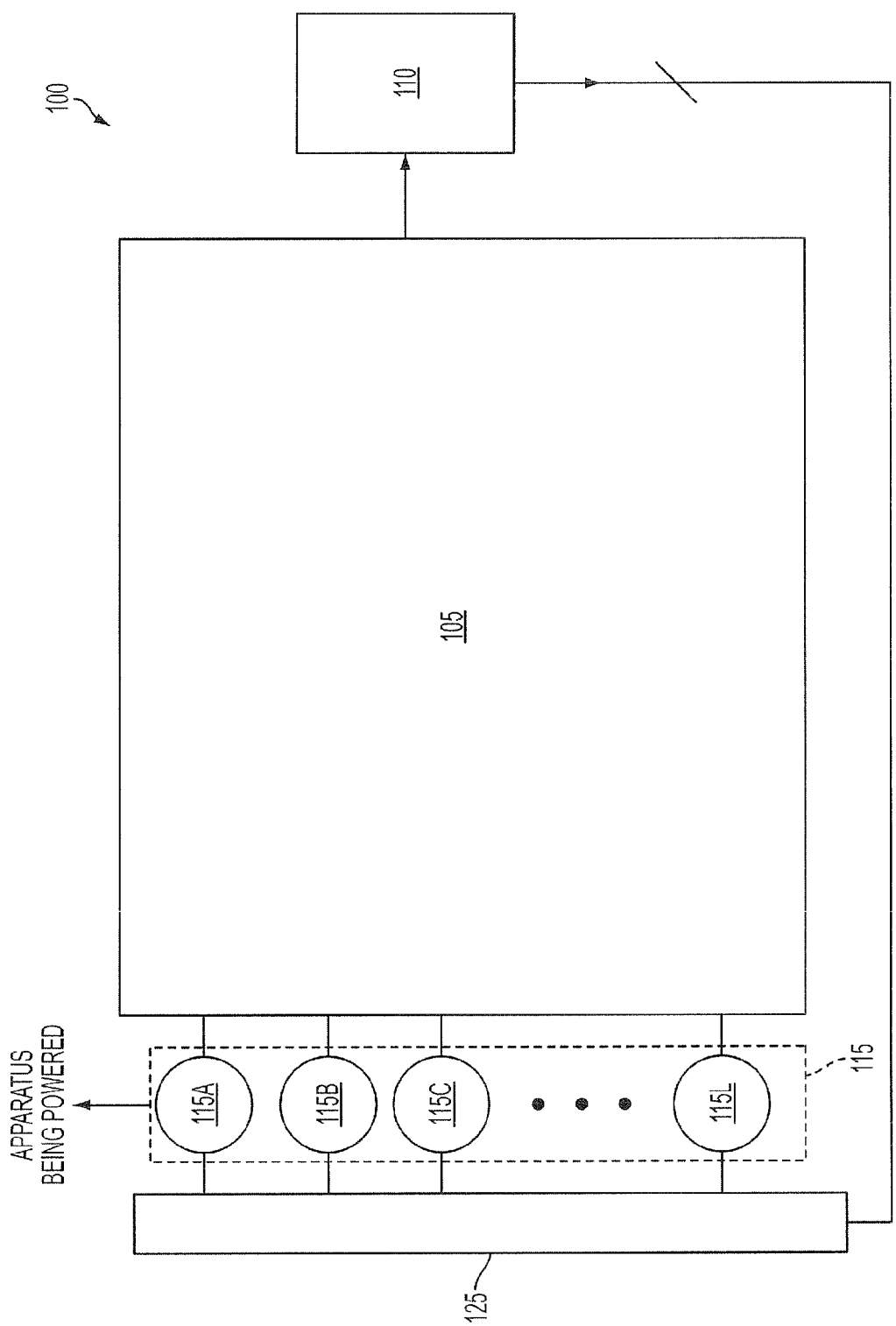
FIG. 1 is a high-level block diagram of a multi-cell battery system having voltage measuring and balancing components according to one embodiment.

FIG. 1 is a block diagram of a multi-cell system 100 that uses simultaneous voltage estimation, in accordance with one embodiment. The system 100 includes multiple Li-ion cells 115A-L, a voltage sampler 105, a controller 110, and a voltage adjustor or balancer 125. To simplify the figure, a connection between the battery pack 115 and the apparatus being powered is not shown. Among other things, the voltage sampler 105 reads voltages on the cells 115A-L, processes the voltages, such as by level-shifting them and converting them to digital values, and routes the digital values to the controller 110 for analysis. The controller 110 processes the digital values, determining voltage differences between the cells 115A-L and corresponding voltage adjustment parameters (e.g., an adjustment or correction voltage or current) to balance the voltages on the cells 115A-D. The controller 110 then sends these parameters or corresponding control signals to the balancer 125, which uses them to balance the voltages on the cells 115A-L.

The cells 115A-L, can be balanced in many ways. As some examples, the balancer 125 (1) shunts recharging voltages so that, during recharging cycles, the higher-charged of the cells 115A-L are recharged more slowly than the lower-charged, (2) controls charge sharing between the cells 115A-L, or (3) during discharging cycles, controls charge dissipation on the higher-charged cells using bypass resistors, to name only a few balancing techniques. The effectiveness of the resulting balancing is directly related to the accuracy of the calculated voltage differences between the cells 115A-L.

As used herein, "voltage balancing" does not necessarily mean exact voltage balancing. Embodiments balance voltages by reducing the differences between voltages on the various cells. While eliminating differences would be ideal, it is recognized that for many applications, small differences can be tolerated.

Figure 2:
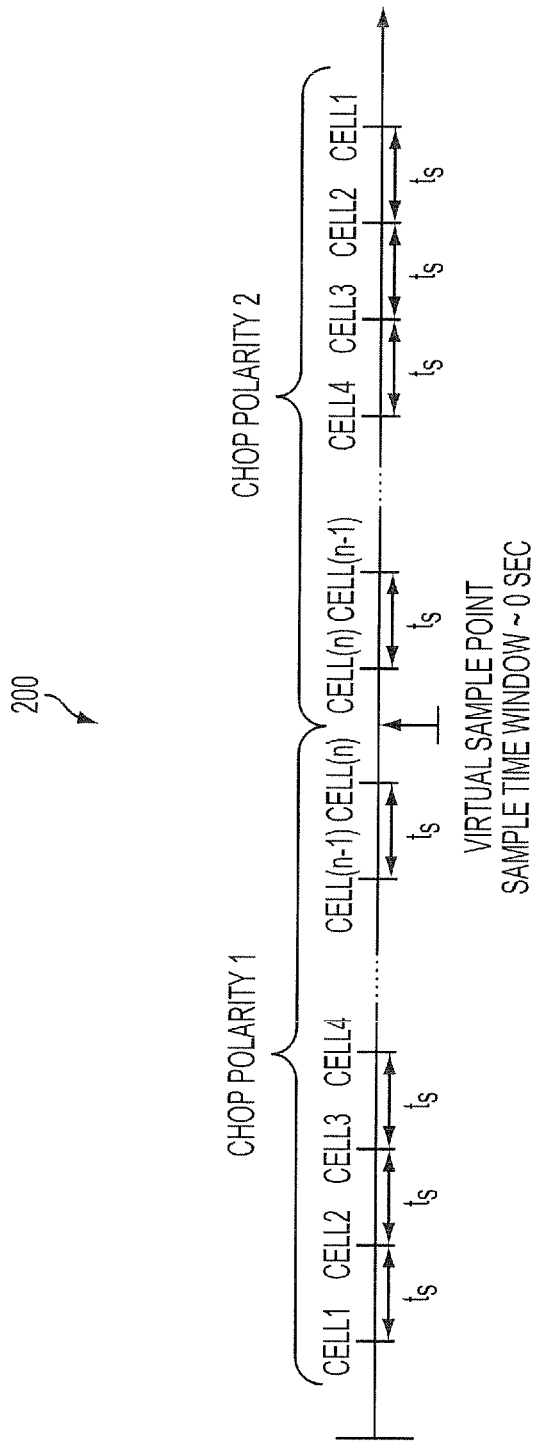
FIG. 2 shows a voltage sampling order according to one embodiment.

FIG. 2 shows how cells, labeled 1 through n (e.g., 115A-L), are sampled over time, in accordance with one embodiment. The cells are sampled sequentially: $Cell_1$ is sampled first, followed by $Cell_2$, followed by $Cell_3$, with increasingly larger indexes, up to $Cell_n$. Next, $Cell_n$ is sampled, followed by $Cell_{(n-1)}$, with sequentially smaller indexes, down to $Cell_1$. Because the sequence of the sampled cells have increasing and then decreasing indexes (e.g., 1, 2, 3, . . . , 12, 12, 11, 10, . . . 2, 1), resembling a pyramid shape, this type of sampling is referred to as "Pyramid Sampling." Indexes are used in this and other examples merely to refer to cells and voltages, and to compare the order of sampling in different time segments (e.g., during "Chop Polarities" as explained below).

As explained in more detail below, the two voltages sensed on each cell are measured at different polarities to reduce measurement errors. Preferably, the different measurement paths switch the inputs to a differential comparator to "chop" the sensed voltage. To indicate this, FIG. 2 shows the first measurements labeled "Chop Polarity 1" and the second measurements labeled "Chop Polarity 2." These measurements on each cell are also taken sequentially: the reading of the voltage on $Cell_1$ at Chop Polarity 1 is taken first followed (some time intervals later) by the reading of the voltage on $Cell_1$ at Chop Polarity 2. As also shown in FIG. 2, to simplify the components used to implement and the equations used to analyze the embodiments, the time intervals between adjacent samples are the same, $t_s$. Other embodiments use varying time intervals between samples.

FIG. 2 labels the midpoint of all the samples as "Virtual Sample Point" with a Sample Time Window of approximately 0 seconds. In other words, the cells are considered sampled at the same time (i.e., all are considered to be sampled with a window size of 0).

In accordance with one embodiment, the estimated virtually simultaneous voltages are the averages of the chop polarity voltages for each cell. For example, the estimated simultaneous voltage for $Cell_1$ is $$\frac{Cell_1(ChopPolarity1) + Cell_1(ChopPolarity2)}{2}.$$

The estimated simultaneous voltage for $Cell_2$ is $$\frac{Cell_2(ChopPolarity1) + Cell_2(ChopPolarity2)}{2}.$$

The estimated simultaneous voltages for $Cell_3$ through $Cell_{12}$ are similarly determined.

Figure 3:
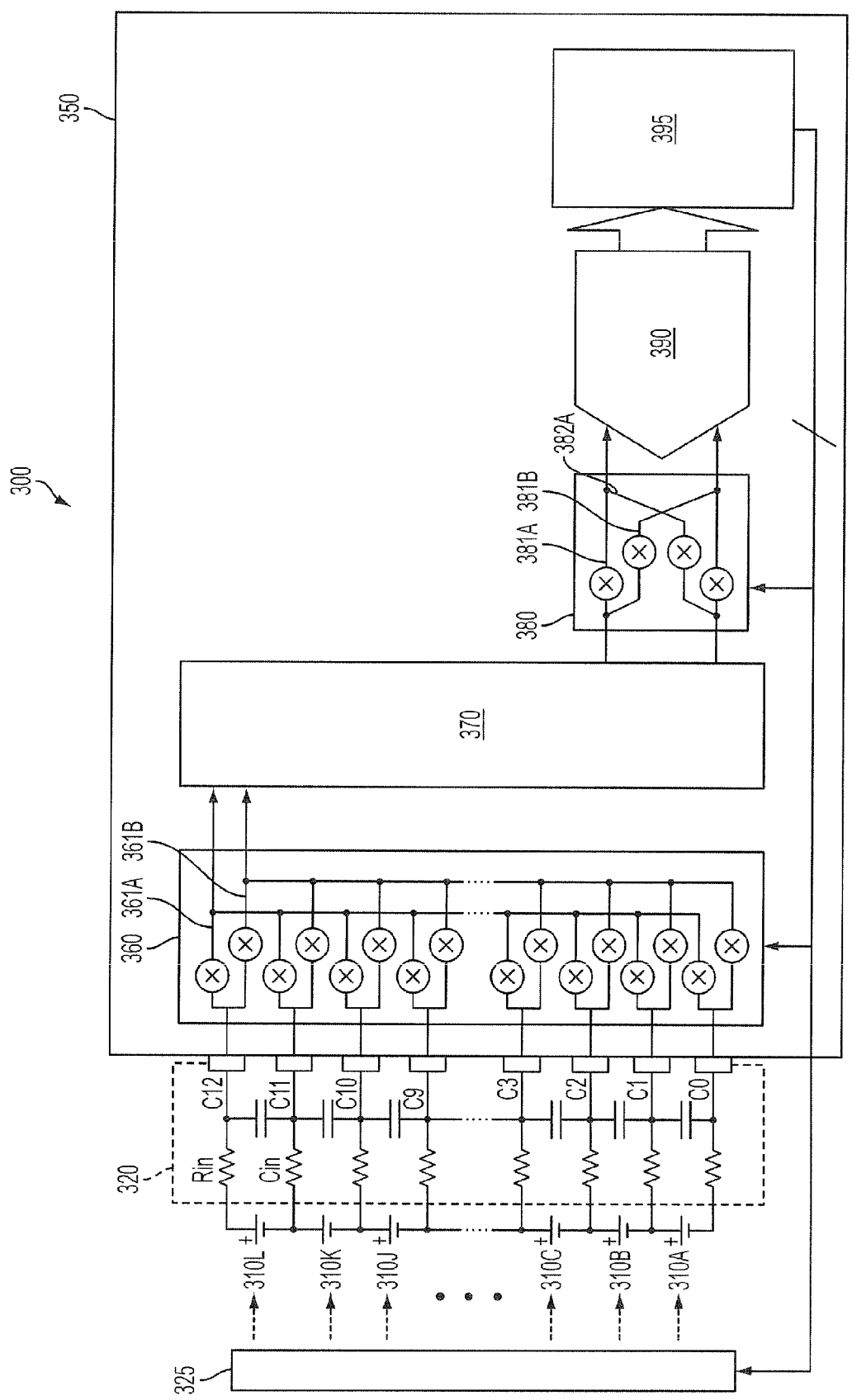
FIG. 3 is a block diagram of a multi-cell battery system having voltage measuring and balancing components according to one embodiment.

FIG. 3 is a more detailed block diagram of a multi-cell system 300 that estimates simultaneous voltages to balance cells in accordance with one embodiment of the invention. The system 300 includes a multiple Li-ion battery pack 310 coupled to a voltage sampler 350 through a first-order RC-filter 320. The first-order RC-filter 320 filters noise, such as that produced by an EV or HEV motor. The voltage sampler 350 is coupled to the battery pack 310 through a voltage balancer 325.

The Li-ion battery pack 310 includes 12 individual Li-ion cells 310A-L. The voltage sampler 350 includes a high-voltage chop multiplexer 360, having inputs coupled to the RC-filter 320 and outputs coupled to an analog high-voltage level shifter 370. The output of the high-voltage level shifter 370 is coupled to a low-voltage chop multiplexer 380, which has outputs coupled to a single analog-to-digital converter (ADC) 390. An output of the ADC 390 is routed to a controller 395, which is operatively coupled to the high-voltage chop multiplexer 360, the low-voltage chop multiplexer 380, and the voltage balancer 325.

In operation, the analog high-voltage level shifter 370 level-shifts a differential battery cell voltage to chip level. Functionally, the high-voltage level shifter 370 not only changes the differential signal amplitude, but it also removes the common mode voltage of a cell with respect to ground. This is preferable for those embodiments in which the ADC 390 only measures differential signals near ground.

As used herein, a "chop multiplexer" refers to a multiplexer that not only routes a selected input to its output, but also switches the polarity of the selected input. Thus, for example, the high-voltage chop multiplexer 360 is operated to couple to the cell 310L at a first polarity over the "top" channel 361A at a time $t_i$ and at a second polarity over the "bottom" channel 361B at a different time $t_2$. Top and bottom channels for chopping voltages on the cells 310A-K are similarly provided. The high-voltage chop multiplexer 360 has two outputs corresponding to each of its top and bottom channels. Similarly, the low-voltage chop multiplexer 380 has top and bottom channels and corresponding outputs. For reference, readings taken along a top channel of both multiplexers 360 and 380 are referred to as "chop polarity 1" and those taken along a bottom channel are referred to as "chop polarity 2." This labeling is arbitrary.

Figure 5:
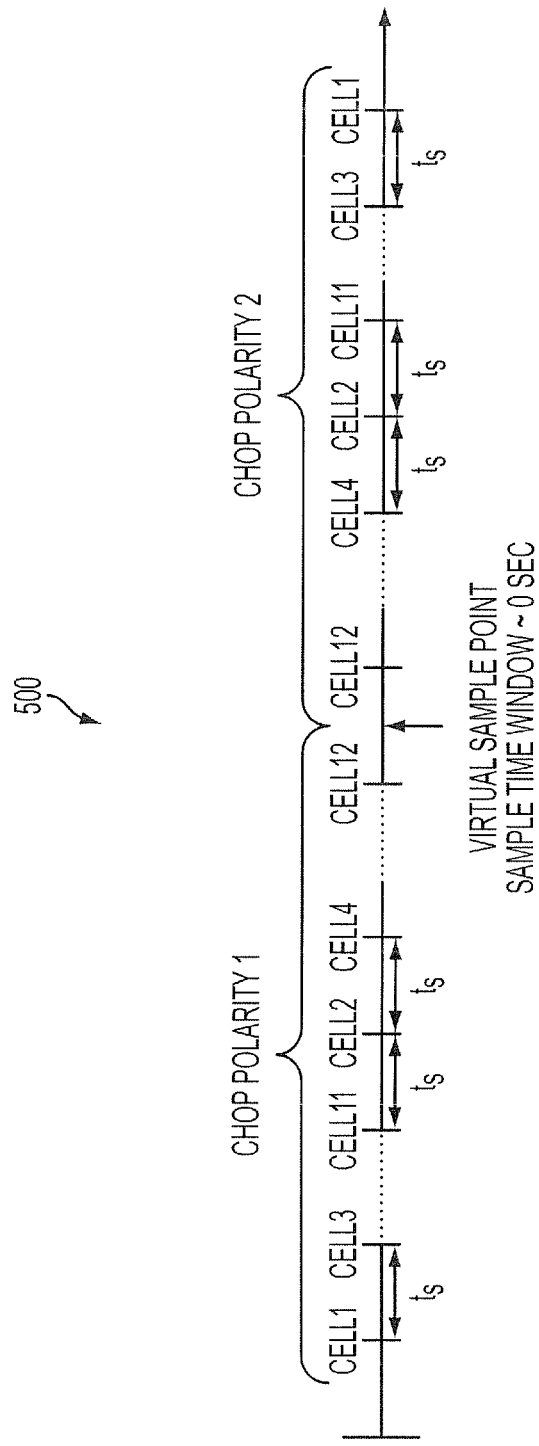
FIG. 5 shows a voltage sampling order according to one embodiment.
Figure 6:
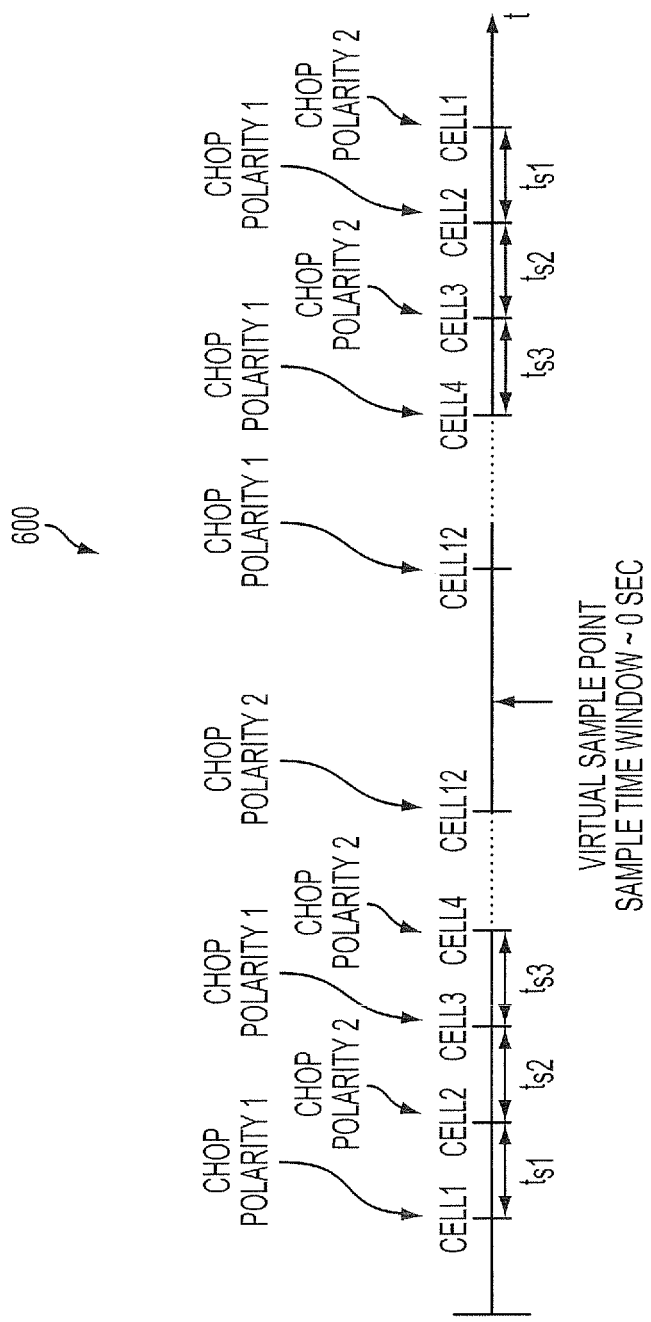
FIG. 6 shows a voltage sampling order according to another embodiment.

In operation, the controller 395 is programmed to switch the high-voltage chop multiplexer 360 to sample in accordance with a pre-determined sampling order and corresponding chop polarities (collectively referred to as a "sampling order"), such as those shown in FIGS. 2, 5, and 6, to name only a few orders. Preferably, the controller 395 is further programmed to control the low-voltage chop multiplexer 380 to chop input voltages to further reduce measurement errors.

The voltages transmitted from the low-voltage chop multiplexer 380 are then routed to the ADC 390, which converts the voltages to digital form and transmits the converted voltages to the controller 395 for processing.

The controller 395 is programmed to receive the voltages from the ADC 390, calculate estimated virtually simultaneous voltages, determine any differences between the estimated simultaneous voltages, and send corresponding adjustment signals to the voltage balancer 325 to balance the voltages on the cells 310A-L. Because the estimated simultaneous voltages are more accurate than those determined in prior art systems, voltages are balanced more precisely.

Figure 4:
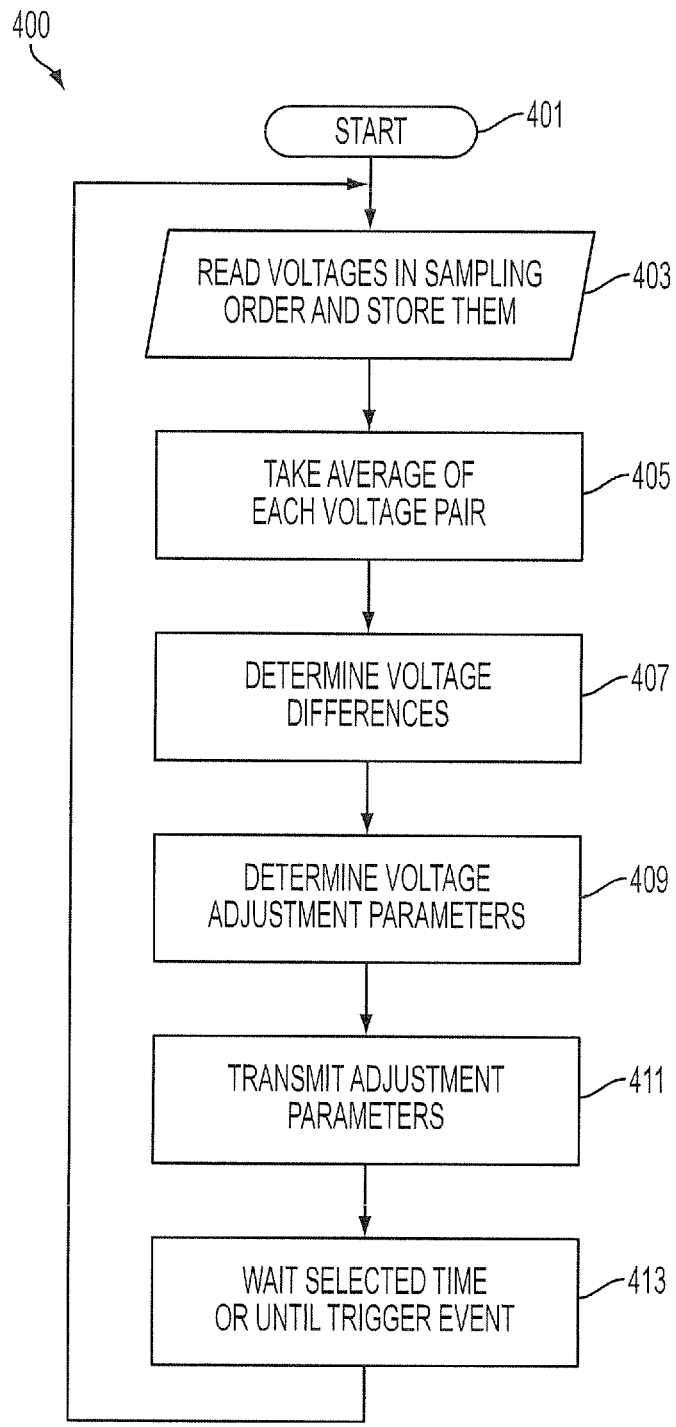
FIG. 4 is a flow chart of steps for estimating virtually simultaneous voltages on multiple cells and using the estimated voltages for cell balancing according to one embodiment.

FIG. 4 is a flow chart for steps performed by the controller 395 in accordance with one embodiment of the invention. In this example, a battery pack contains 12 cells and the voltages on all the cells are sampled twice, once for each chop polarity, within a predetermined time window. In the preferred embodiment, the time window is 100 microseconds wide. In this preferred embodiment, the sampling interval between voltage readings ($t_s$) is thus $$\frac{100 \ \mu s}{12}$$

or about 8.3 μs.

Referring to FIGS. 3 and 4, in the start step 401, the controller 395 is initialized with the sampling order (e.g., FIG. 2) and the sampling interval, $t_s$. Next, in the step 403, the controller 395 switches the high-voltage chop multiplexer 360 to switch the voltages on the cells 310A-L in the sampling order shown in FIG. 2. Each voltage on a cell is sampled twice, to form a voltage pair, one reading at a first polarity (e.g., Chop Polarity 1, along 361A in element 360) and another at a second polarity (e.g., Chop Polarity 2, along 361B in element 360). The readings in each pair are made sequentially. The voltages are routed to the analog high-voltage level shifter 370, which reduces the voltages to a level suitable for processing. In one embodiment, the voltages are reduced from about 4 V to 2.5 V. The low-voltage chop multiplexer 380 is operable at this lower voltage. As one example, "high" voltage is 4 V or more, and a "low" voltage is 2.5 V or less. Of course, the voltages can be shifted between other values to suit the components used.

The voltages transmitted from the analog high-voltage level shifter 370 are then transmitted to the low-voltage chop multiplexer 380. The controller 395 directs the low-voltage chop multiplexer 380 to again "chop" the voltages from each of the cells (e.g., Chop Polarity 1, along 381A, and later Chop Polarity 2, along 381B), again to reduce measurement errors. The chopped voltages are then transmitted to the single ADC 390, which converts the analog voltages to digital, and then transmits the converted voltages to the controller 395.

In the step 405, the controller 395 reads the voltages and determines the estimated simultaneous voltages (e.g., the averages of the chopped polarities for each cell $Cell_1$ through $Cell_{12}$) and, in the step 407, determines any differences between the estimated simultaneous voltages. In the step 409, the controller 395 uses these differences to determine adjustments for balancing the voltages. The adjustments can include correction voltages or currents and corresponding charging or discharging times. In the step 411 the controller 395 transmits these adjustments to the voltage balancer 325 to balance the voltages on the cells $Cell_1$ through $Cell_{12}$. Finally, in the step 413, the controller 395 either repeats immediately or waits a selected time or until a triggering event occurs, before looping back to the step 403. As some examples, a triggering event is a braking or an accelerating of an automobile powered by the battery pack 310.

In one embodiment, the controller 395 includes a processor and a computer-readable medium containing programmed executable instructions that implement a state machine for performing the steps 400. In another embodiment, the controller 395 includes one or more application-specific integrated circuits programmed to implement a state machine to perform the steps 400. In still other embodiments, the controller 395 includes a combination of hardware, software, or any other means for implementing a state machine to perform the steps 400.

The steps 400 are merely illustrative of one embodiment. Some of the steps shown can be deleted, others can be added, and those shown can be performed in different orders.

It will be appreciated that the functionality of the controller 395 can be distributed among the different components. As one example, the high-voltage chop multiplexer 360 itself contains circuitry that controls sequentially selecting and chopping the inputs according to a sampling order.

It will also be appreciated that other sampling orders, different from that shown in FIG. 2, can be used in accordance with the embodiments. FIG. 5 shows another sampling order 500, in which all the odd-indexed cells (i.e., $Cell_1$, $Cell_3$, etc.) are sampled first, followed by the even-indexed cells (i.e., $Cell_2$, $Cell_4$, etc.), all sampled using Chop Polarity 1. The cells are then sampled in the reverse order using Chop Polarity 2, such that the pair of voltage readings for all the cells (e.g., $Cell_1$ (Chop Polarity 1) and $Cell_1$ (Chop Polarity 2) as one pair, $Cell_3$ (Chop Polarity 2 and $Cell_3$ (Chop Polarity 2) as another pair) all share a common midpoint in time. In other words, the readings (ignoring the chop polarities) are symmetric with respect to the midpoint in time, labeled again as "Virtual Sample Point".

In one embodiment, the high-voltage chop multiplexer 360 and the low-voltage chop multiplexer 380 are synchronized to have the same chop polarities during voltage readings. In another embodiment, they have opposite polarities. In still other embodiments, only one of the multiplexers 360 and 380 is a chop multiplexer.

In yet another embodiment, the low-voltage chop multiplexer 380 is not included, but its function is performed digitally by the ADC 390. In this embodiment, the controller 390 takes voltage pairs (e.g., two chopped voltages), subtracts them from each other, and divides the difference by two to generate the virtually simultaneous voltage for the corresponding voltage source. In this embodiment, the ADC 390 is able to measure bipolar signals that cover the positive and negative voltages in each voltage pair.

FIG. 6 shows a sampling order 600 in accordance with still another embodiment. In this embodiment, the cells are again sampled in pairs, but this time the chop polarities alternate and the sampling intervals are not the same. Referring to both FIGS. 2 and 6, the voltage on $Cell_1$ is sampled first at Chop Polarity 1. The voltage on $Cell_2$ is sampled $t_{S1}$ seconds later, but at Chop Polarity 2, followed by the voltage on $Cell_3$, $t_{s2}$ seconds later, at Chop Polarity 1. In the first sequence of samples, the chop polarities alternate and the time intervals ($t_{Si}$) vary. In the second sequence of samples, to the right of the "Virtual Sample Point," the chop polarities are the opposite for each Cell (e.g., the voltage on $Cell_1$ is now sampled at Chop Polarity 2), but the time intervals (e.g., between $Cell_1$ and $Cell_2$) are identical to those in the first sequence. As in the examples of FIGS. 2 and 5, all pairs of readings (e.g., the voltage reading on $Cell_1$ at Chop Polarity 1 and the voltage reading on $Cell_1$ at Chop Polarity 2) share a common midpoint in time.

Some applications, such as fuel gauging in EVs and HEVs, benefit from not only virtually simultaneous voltage readings but also from simultaneous current readings. Knowing the state of a charge is important for Hybrid vehicles, to better determine when to turn on the engine. Virtually simultaneous voltages in combination with simultaneous currents can be used by fuel-gauging algorithms to make this determination.

In one embodiment, a current sensor (not shown) is placed in the current paths, either directly or shunted, between multiple voltage sources and an EV or HEV motor. Those skilled in the art will recognize other ways to determine simultaneous current readings. Those skilled in the art will also recognize how to calculate the state of charge from the voltages and currents determined in accordance with the embodiments of the invention.

Figure 7:
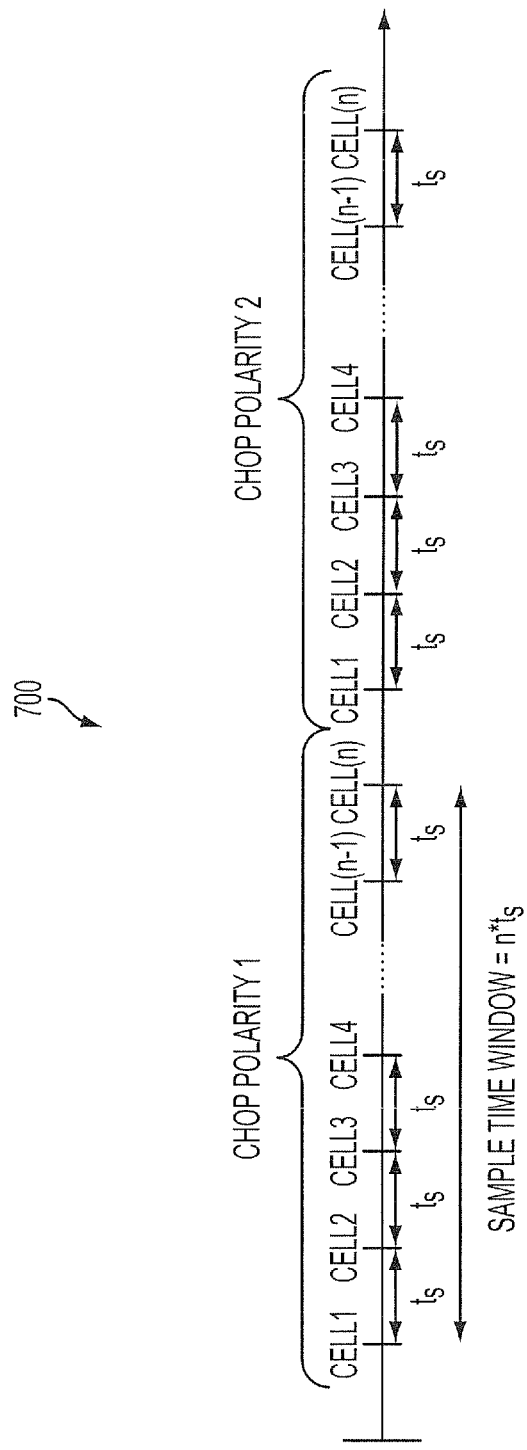
FIG. 7 shows a voltage sampling order used to explain the step response in FIG. 8.

Experimental data highlight the advantages of estimating simultaneous voltages in accordance with embodiments of the invention. As one example, a system samples cell voltages in the same sequence for two chop polarities, as illustrated by the sampling order shown in FIG. 7. The standard error for this system in response to a step input is calculated as follows:

$$V_{ERR\_STANDARD} = V_0 - V_1$$
$$= \Delta V\left(1 - e^{-\frac{t_1}{\tau}}\right)$$
$$= \Delta V\left(1 - e^{-\frac{n \cdot t_s}{\tau}}\right)$$

$$e^x \approx 1 + x + \frac{x^2}{2}$$

$$V_{ERR\_STANDARD} \approx \Delta V\left(1 - 1 + \frac{n \cdot t_s}{\tau}\right)$$
$$= \Delta V \cdot \frac{n \cdot t_s}{\tau} \quad for \ n \cdot t_s << \tau$$

where
$V_0$ is the voltage in a first sample;
$V_1$ is the voltage in a last sample;
n is the number of analog-to-digital inputs being sampled;
$t_s$ is the conversion/sample rate of the ADC used (e.g., element 390 in FIG. 3); and
$\tau$ is the RC time constant of the filter (e.g., element 320 in FIG. 3) external to the IC (e.g, element 350 in FIG. 3).

Figure 8:
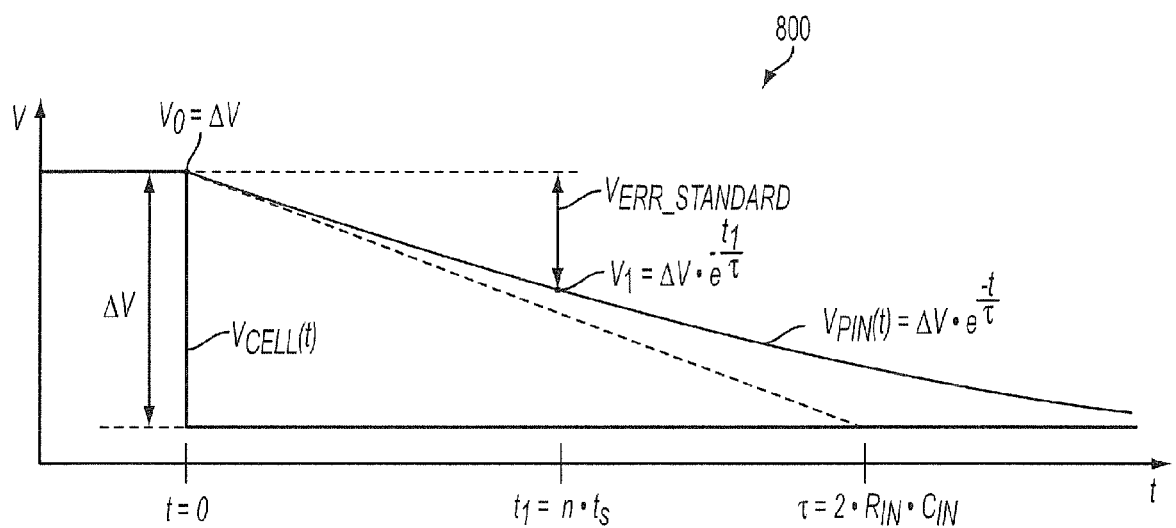
FIG. 8 is a graph of a step response for a system using the sampling order shown in FIG. 7.

This response of voltage versus time is shown graphically in FIG. 8. $V_{PIN}$, shown in FIG. 8, is the actual voltage on the IC (e.g., element 350 in FIG. 3).

In comparison, the error for a system using a pyramidal sampling order in accordance with embodiments in response to a step input is calculated as follows:

$$V_{SAMP} = \Delta V \cdot e^{-\frac{1}{2} \cdot \frac{t_1}{\tau}}$$

$$V_{MEAS} = \frac{V_1 + V_0}{2}$$
$$= \Delta V \cdot \frac{\left(1 + e^{-\frac{t_1}{\tau}}\right)}{2}$$

$$e^x \approx 1 + x + \frac{x^2}{2}$$

-continued $$V_{ERR\_PYRAMID} = V_{SAMP} - V_{MEAS}$$

$$= \Delta V \left( e^{-\frac{t_1}{2\tau}} - \frac{1}{2} \cdot e^{-\frac{t_1}{\tau}} - \frac{1}{2} \right)$$

$$= \Delta V \left( e^{-\frac{2n \cdot t_s}{2\tau}} - \frac{1}{2} \cdot e^{-\frac{2n \cdot t_s}{\tau}} - \frac{1}{2} \right)$$

$$V_{ERR\_PYRAMID} \approx \Delta V \left( 1 - \frac{t_1}{2\tau} + \frac{t_1^2}{8\tau^2} - \frac{1}{2} + \frac{1}{2} \cdot \frac{t_1}{\tau} - \frac{t_1^2}{4\tau^2} - \frac{1}{2} \right)$$

$$= \Delta V \left[ \frac{1}{4} \left[ \frac{t_1}{\tau} \right]^2 \right]$$

$$= \Delta V \left[ \frac{n \cdot t_s}{\tau} \right]^2$$

where, in addition to the parameters explained above,
$V_{SAMP}$ is the sampled voltage; and
$V_{MEAS}$ is the estimated simultaneous voltage.

Figure 9:
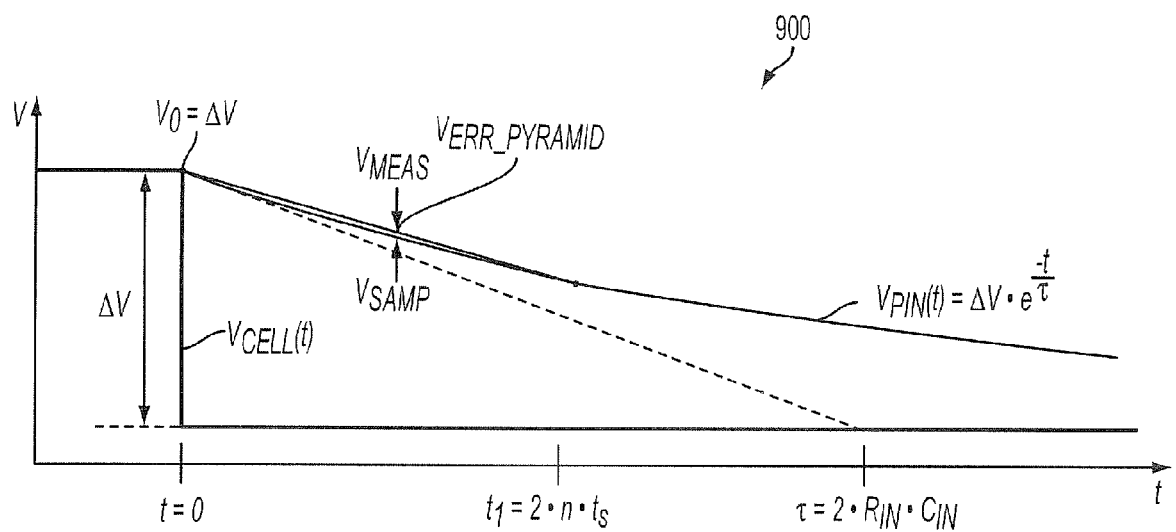
FIG. 9 is a graph of a step response for a system using a pyramidal sampling step according to one embodiment.

This response of voltage versus time is shown graphically in FIG. 9.

In sum, $$V_{ERR\_PYRAMID} \approx \Delta V \left[ \frac{n \cdot t_s}{\tau} \right]^2$$

and $$V_{ERR\_STANDARD} \approx \Delta V \cdot \frac{n \cdot t_s}{\tau} \text{ for } n \cdot t_s \ll \tau$$

Thus, for a step response, pyramidal sampling in accordance with embodiments of the invention makes a first-order RC filter (e.g., element 320 in FIG. 3) behave like a second-order RC filter. This reduced filter burden lowers cost.

While the examples illustrate 12-cell battery pack systems, it will be appreciated that embodiments are useful with any number of cells, including packs with as many as hundreds of cells or as few as two cells. The invention is useful not only for HEVs but for any application that uses multiple cells and relies on voltage balancing. And while the examples show using a 100 µs sampling window, other sampling windows, both larger and smaller, can also be used.

It will be readily apparent to one skilled in the art that other modifications may be made to the embodiments without departing from the spirit and scope of the invention as defined by the appended claims.

We claim:

1. An apparatus for reading voltages from multiple voltage sources comprising:
a first multiplexer for coupling to multiple voltage sources; and
a controller programmed to output from the first multiplexer a sequential pair of voltages read from each of the multiple voltage sources, each voltage of the sequential pair is read at different times, the multiple sequential pairs of voltages share a common midpoint in time.

2. The apparatus of claim 1, further comprising an R-C filter coupling the multiple voltage sources to the first multiplexer.

3. The apparatus of claim 2, wherein the RC-filter is a first-order filter.

4. The apparatus of claim 2, further comprising multiple voltage sources coupled to the RC-filter.

5. The apparatus of claim 1, wherein the first multiplexer is a high-voltage chop multiplexer.

6. The apparatus of claim 1, wherein an output of the first multiplexer is coupled to an analog high-voltage level shifter, coupled to a single analog-to-digital converter.

7. The apparatus of claim 6, further comprising a low-voltage chop multiplexer coupling the analog high-voltage level shifter to the single analog-to-digital converter.

8. The apparatus of claim 1, wherein the controller is further programmed to use the multiple sequential pairs of voltages to estimate simultaneous readings of the multiple voltages.

9. The apparatus of claim 8, wherein the controller is further programmed to determine from the estimated simultaneous readings parameters for substantially balancing the multiple voltages.

10. The apparatus of claim 9, further comprising a voltage balancer operable with the controller to substantially balance the multiple voltage sources.

11. The apparatus of claim 1, wherein the controller is further programmed to output from the first multiplexer the multiple sequential pairs of voltages within a 100 microsecond window.

12. The apparatus of claim 1, further comprising an automobile engine powered by the multiple voltage sources.

13. A method of estimating simultaneous readings of multiple voltages comprising:
taking a sequential pair of voltage readings from each of multiple voltage sources, each voltage of the sequential pair is read at different times, wherein the multiple sequential pairs share a common midpoint in time; and
averaging each of the multiple sequential pairs to thereby estimate simultaneous readings of the multiple voltage sources.

14. The method of claim 13, wherein for each of the multiple voltages sources, the sequential pair of voltage readings the is taken at different polarities to thereby reduce measurement errors.

15. The method of claim 13, further comprising filtering voltages on each of the multiple voltage sources.

16. The method of claim 15, wherein the filtering is a first-order RC filtering.

17. The method of claim 13, further comprising powering an automobile engine with the multiple voltage sources.

18. The method of claim 13, wherein each of the multiple voltage sources comprises a lithium-ion battery.

19. The method of claim 13, wherein the multiple sequential pairs of voltage readings are all taken within a 100 microsecond window.

20. The method of claim 13, further comprising determining simultaneous current readings from each of the multiple voltage sources to a motor, and using the multiple current readings and the estimated simultaneous readings from the multiple voltage sources in a fuel-gauging algorithm.

21. A method of balancing voltages from multiple voltage sources comprising:
averaging multiple voltages that comprise one or more sequential pairs of readings from each of the multiple voltage sources, each voltage of the sequential pair is read at different times, the sequential pairs share a common midpoint in time; and
using the multiple averaged voltages to control charging, discharging, or both of the multiple voltage sources to thereby balance the voltages on the multiple voltage sources.

22. The method of claim 21, further comprising powering an automobile engine with the multiple voltage sources.

23. The method of claim 21, further comprising reading the multiple voltage sources within a 100 microsecond window.

24. The method of claim 21, wherein each pair of the sequential readings is taken at different polarities.

25. The method of claim 21, wherein each of the multiple voltage sources comprises a lithium ion battery.

\* \* \* \* \*